(12) United States Patent
Shin

(10) Patent No.: US 7,994,591 B2
(45) Date of Patent: Aug. 9, 2011

(54) SEMICONDUCTOR DEVICE AND METHOD FOR MANUFACTURING THE SAME

(75) Inventor: Eun Jong Shin, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 267 days.

(21) Appl. No.: 12/326,032

(22) Filed: Dec. 1, 2008

(65) Prior Publication Data

US 2009/0140354 A1 Jun. 4, 2009

(30) Foreign Application Priority Data

Dec. 3, 2007 (KR) .......................... 10-2007-0124197

(51) Int. Cl.
*H01L 21/02* (2006.01)
(52) U.S. Cl. .......... 257/411; 257/E21.409; 257/E29.255
(58) Field of Classification Search .................. 438/287; 257/411, E21.409, E29.255
See application file for complete search history.

(56) References Cited

U.S. PATENT DOCUMENTS

| | | | | |
|---|---|---|---|---|
| 5,548,153 | A * | 8/1996 | Muragishi ..................... | 257/365 |
| 7,176,522 | B2 * | 2/2007 | Cheng et al. .................. | 257/338 |
| 7,265,401 | B2 | 9/2007 | Yamaguchi et al. | |
| 7,521,325 | B2 | 4/2009 | Sakoda et al. | |
| 7,576,399 | B2 * | 8/2009 | Li ................................ | 257/412 |
| 7,626,864 | B2 * | 12/2009 | Wang ....................... | 365/185.18 |
| 2006/0172498 | A1 | 8/2006 | Yamaguchi et al. | |
| 2006/0214243 | A1 | 9/2006 | Sakoda et al. | |

FOREIGN PATENT DOCUMENTS

| | | |
|---|---|---|
| JP | 2005064032 A | 3/2005 |
| KR | 10-2006-0002127 A | 1/2006 |
| KR | 10-0757026 A | 10/2006 |

OTHER PUBLICATIONS

M. Inoue, S. Tsujikawa, M. Mizutani, K. Nomura, T. Hayashi, K. Shiga, J. Yugami, J. Tsuchimoto, Y. Ohno, and M. Yoneda; "Fluorine Incorporation into HfSiON Dielectric for V th Control and Its Impact on Reliability for Poly-Si Gate pFET"; IEEE Xplore; Publication Date: Aug. 2005; Japan.

Chinese Office Action date-stamped Oct. 30, 2009; Chinese Patent Application No. 2008101797542; The State Intellectual Property Office of the P.R.C., People's Republic of China.

Tomonori Aoyama; "Semiconductor Device and its Manufacturing Method"; esp@cenet; Abstract of Publication No. JP2005064032 (A); Publication Date: Mar. 10, 2005; espacenet database—Worldwide, http://v3.espacenet.com/publicationDetails/biblio?DB=EPODOC&adja....

(Continued)

*Primary Examiner* — Matthew W Such
*Assistant Examiner* — Monica D Harrison
(74) *Attorney, Agent, or Firm* — The Law Offices of Andrew D. Fortney; Andrew D. Fortney

(57) ABSTRACT

Disclosed are a semiconductor device and a method for manufacturing the same. The semiconductor device includes a gate structure which includes a silicon oxynitride (SiON) layer formed on a semiconductor substrate, a hafnium silicon oxynitride (HfSiON) layer formed on the silicon oxynitride (SiON) layer, a polysilicon layer formed on the hafnium silicon oxynitride (HfSiON) layer, and a silicide layer formed on the polysilicon layer, spacers at sidewalls of the gate structure, and source and drain regions at opposite sides of the gate structure.

19 Claims, 4 Drawing Sheets

OTHER PUBLICATIONS

Doo Yeol Ryoo; "Method for Fabricating Semiconductor Device to Reduce Leakage Current of Gate Insulation Layer"; Korean Patent Abstracts; Publication No. 1020060002127 A; Publication Date: Jan. 9, 2006; Korean Intellectual Property Office, Republic of Korea.

Tsunehisa Sakoda, Masaomi Yamaguchi, Hiroshi Minakata, Yoshihiro Sugita and Kazuto Ikeda; "Method for Manufacturing Semiconductor Device Capable of Preventing Threshold Voltage Shift"; Korean Patent Abstracts; Publication No. 1020060103805 A; Publication Date: Oct. 4, 2006; Korean Intellectual Property Office, Republic of Korea.

Korean Office Action dated May 29, 2009; Korean Patent Application No. 10-2007-0124197; Korean Intellectual Property Office, Republic of Korea.

* cited by examiner

SEMICONDUCTOR DEVICE AND METHOD FOR MANUFACTURING THE SAME

The present application claims priority under 35 U.S.C. §119(e) of Korean Patent Application No. 10-2007-0124197 (filed on Dec. 3, 2007), which is hereby incorporated by reference in its entirety.

BACKGROUND

The invention relates to a semiconductor device and a method for manufacturing the same.

In order to raise the speed of a transistor, studies and research have been extensively performed regarding a gate structure using a metal gate and a high-k gate insulating material to realize a low gate work function and a vertical electric field.

Generally, hafnium (Hf)-based metal gate oxide is used as the high-k gate insulating material. In this case, Hf pinning may occur on an interfacial surface between a gate electrode and the metal gate oxide or an interfacial surface between the metal gate oxide and a silicon substrate, thereby causing a flat band shift phenomenon.

Accordingly, a threshold voltage (Vth) of the transistor may be shifted, and degradation of negative bias temperature instability (NBTI) may be caused.

SUMMARY

The invention provides a semiconductor device and a method for manufacturing the same.

Embodiments of the invention also provide a semiconductor device and a method for manufacturing the same, capable of reducing pinning caused by hafnium (Hf).

According to certain embodiment(s), a semiconductor device includes a gate structure which includes a silicon oxynitride (SiON) layer on a semiconductor substrate, a hafnium silicon oxynitride (HfSiON) layer on the silicon oxynitride (SiON) layer, a polysilicon layer on the hafnium silicon oxynitride (HfSiON) layer, and a silicide layer on the polysilicon layer, spacers at sidewalls of the gate structure, and source and drain regions at opposite sides of the gate structure.

According to other embodiment(s), a method for manufacturing a semiconductor device includes the steps of forming a gate structure by forming a silicon oxide (SiOx) layer on a semiconductor substrate, forming a hafnium silicate (HfSiO) layer on the silicon oxide (SiOx) layer, forming a silicon oxynitride (SiON) layer and a hafnium silicon oxynitride (HfSiON) layer by performing a nitrogen plasma process on the semiconductor substrate including the silicon oxide (SiOx) layer and the hafnium silicate (HfSiO) layer, forming a polysilicon layer on the hafnium silicon oxynitride (HfSiON) layer, growing a silicon germanium (SiGe) layer on the polysilicon layer, and patterning the silicon oxynitride (SiON) layer, the hafnium silicon oxynitride (HfSiON) layer, the polysilicon layer, and the silicon germanium (SiGe) layer, forming spacers and source and drain regions at sides of the gate structure, and forming a gate electrode by siliciding the silicon germanium (SiGe) layer.

DETAILED DESCRIPTION OF THE EMBODIMENTS

Hereinafter, a semiconductor device and a method for manufacturing the same according to embodiments of the invention will be described in detail with reference to accompanying drawings.

FIGS. 1 to 7 are views showing an exemplary semiconductor device and an exemplary method for manufacturing the same.

Figure 7:
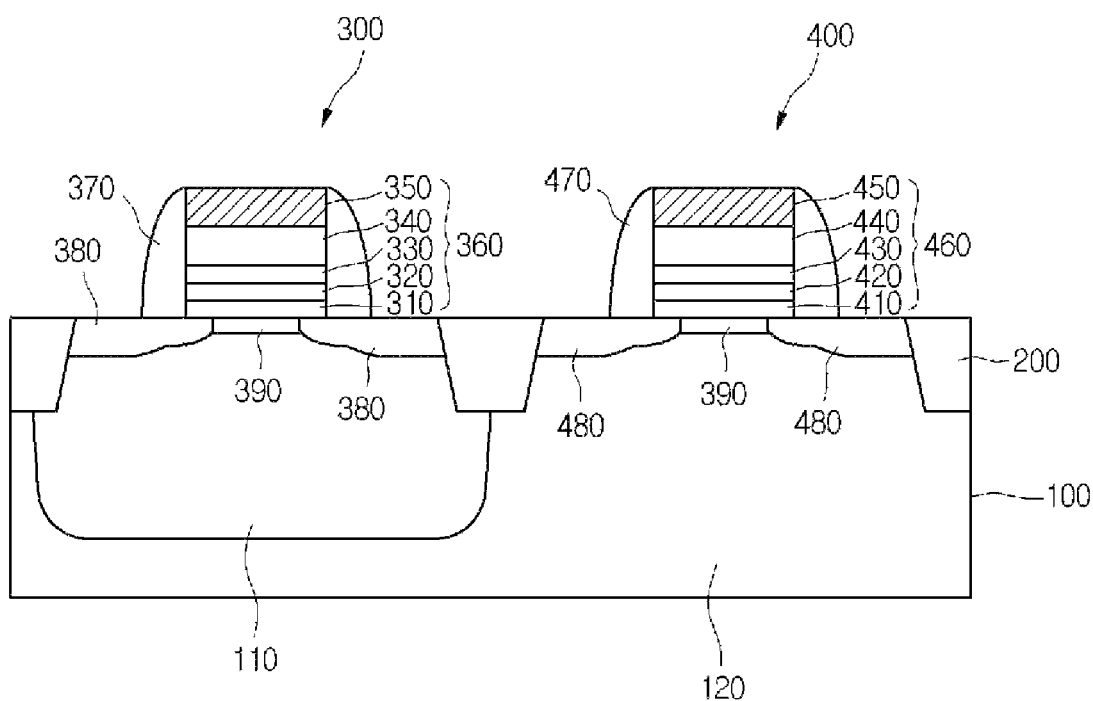

Referring to FIG. 7, an exemplary semiconductor device includes a semiconductor substrate 100, an isolation layer 200 defining active regions on the semiconductor substrate 100, and an NMOS transistor 300 and a PMOS transistor 400 formed in the active regions.

The isolation layer 200 includes an insulating material, and may be formed by a shallow trench isolation (STI) process and/or a local oxidation of silicon (LOCOS) process.

The semiconductor substrate 100 includes a P well region 110 doped with P-type impurities and an N well region 120 doped with N-type impurities.

The NMOS transistor 300 is formed on the P well region 110. The NMOS transistor 300 includes a gate structure 360, spacers 370 formed at sidewalls of the gate structure 360, and source/drain regions 380 formed in the active region provided at opposite sides of the gate structure 360. A fluorine-containing layer 390, which is implanted with fluorine, may be formed in a channel region below the gate structure 360.

Meanwhile, the gate structure 360 includes a silicon oxynitride (SiON) layer 310, a first hafnium silicon oxynitride (HfSiON) layer 320, a second HfSiON layer 330, a polysilicon layer 340, and a silicide layer 350.

The second HfSiON layer 330 includes a content of hafnium (Hf) that is less than that of the first HfSiON layer 320, and the polysilicon layer 340 may include fluorine ions.

The polysilicon layer 340 implanted with the fluorine ions prevents Hf pinning caused by the first and second HfSiON layers 320 and 330.

The silicide layer 350 may have a fully silicided nickel (Ni FUSI) structure. Since the above Ni FUSI structure has a characteristic of a low work function, the Ni FUSI structure can prevent degradation of the mobility of electrons and/or holes.

Although not shown, silicide may also be formed on the source/drain regions 380.

Similarly, the PMOS transistor 400 is formed on the N well region 120. The PMOS transistor 400 includes a gate structure 460, spacers 470 formed at sidewalls of the gate structure 460, and source/drain regions 480 formed in the active region at opposite sides of the gate structure 460. In addition, the fluorine-containing layer 390, which is implanted with fluorine, may be formed in a channel region below the gate structure 460.

Meanwhile, the gate structure 460 includes a SiON layer 410, a first HfSiON layer 420, a second HfSiON layer 430, a polysilicon layer 440, and a silicide layer 450.

The second HfSiON layer 430 includes a content of Hf less than that of the first HfSiON layer 420, and the polysilicon layer 440 may include fluorine ions.

The polysilicon layer 440 implanted with the fluorine ions prevents Hf pinning caused by the first and second HfSiON layers 420 and 430.

The silicide layer 450 may have a Ni FUSI structure. Since the above Ni FUSI structure has a characteristic of a low work function, the Ni FUSI structure can prevent mobility of electrons and/or holes from being degraded.

Although not shown, silicide may also be formed on the source/drain regions 480.

Meanwhile, in certain embodiments, the gate structures 360 and 460 include the SiON layers 310 and 410, the first HfSiON layers 320 and 420, the second HfSiON layers 330 and 430, the polysilicon layers 340 and 440, and the silicide layers 350 and 450. The second HfSiON layers 330 and 430 and the polysilicon layers 340 and 440 can be selectively formed.

For example, according to another embodiment, the gate structures 360 and 460 may include the SiON layers 310 and 410, the first HfSiON layers 320 and 420, the polysilicon layers 340 and 440, and the silicide layers 350 and 450.

According to still another embodiment, the gate structures 360 and 460 may include the SiON layers 310 and 410, the first HfSiON layers 320 and 420, the second HfSiON layers 330 and 430, and the silicide layer 350 and 450.

Hereinafter, an exemplary method for manufacturing the semiconductor device according to a first embodiment will be described in detail with reference to FIGS. 1 to 7.

Figure 1:
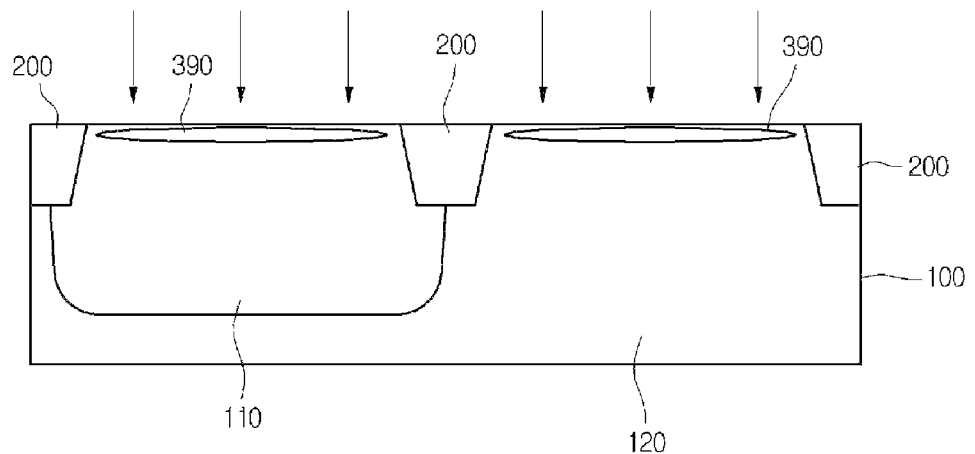
FIGS. 1 to 7 are views showing a semiconductor device and a method for manufacturing the same according to various embodiments.

Referring to FIG. 1, the isolation layer 200 is formed on the semiconductor substrate 100 to define the active region. The isolation layer 200 may be formed by a shallow trench isolation (STI) process and/or a local oxidation of silicon (LOCOS) process.

Then, P-type impurities and N-type impurities are selectively implanted, thereby forming the P well region 110 and the N well region 120.

At this time, fluorine ions may be implanted into the surface of the semiconductor substrate 100 with the P well region 110 and the N well region 120, so that the fluorine-containing layer 390 may be formed. The fluorine-containing layer 390 may be selectively formed (e.g., by masking non-implanted areas prior to implantation). The fluorine of the fluorine-containing layer 390 is activated through a well anneal process for the P and N well regions 110 and 120.

The fluorine-containing layer 390 can prevent pinning between the Hf of a HfSiON layer and a Si lattice of the semiconductor substrate 100.

Figure 2:
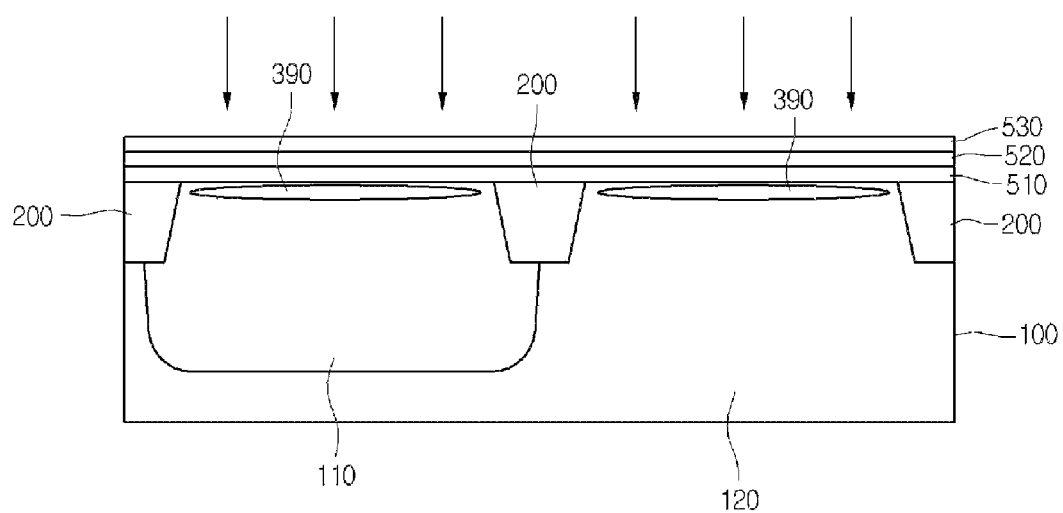

Referring to FIG. 2, a silicon oxide layer ($SiO_2$) is formed on the semiconductor substrate 100 by thermal oxidation. Thereafter, HfSiO, which contains Hf in a ratio of 40% to 60%, is deposited on the thermal $SiO_2$ layer, and then HfSiO, which contains Hf in a ratio of 5% to 10%, is deposited, both by metal organic chemical vapor deposition (MOCVD).

Then, nitrogen gas ($N_2$) is reacted with the HfSiO and $SiO_2$ (e.g., at a temperature of 800° C. to 850° C.) through a remote plasma nitridation (RPN) process, so that an SiON layer 510, a first HfSiON layer 520, and a second HfSiON layer 530 are formed on the semiconductor substrate 100.

The second HfSiON layer 530 has an Hf content less than that of the first HfSiON layer 520, thereby reducing pinning for a Si lattice caused by the Hf.

During the plasma nitridation (e.g., RPN) process, the nitrogen ions are implanted, thereby improving any poor interface roughness of a contact surface between the semiconductor device 100 and an insulating layer structure including the SiON layer 510 and the first and second HfSiON layers 520 and 530.

Figure 3:
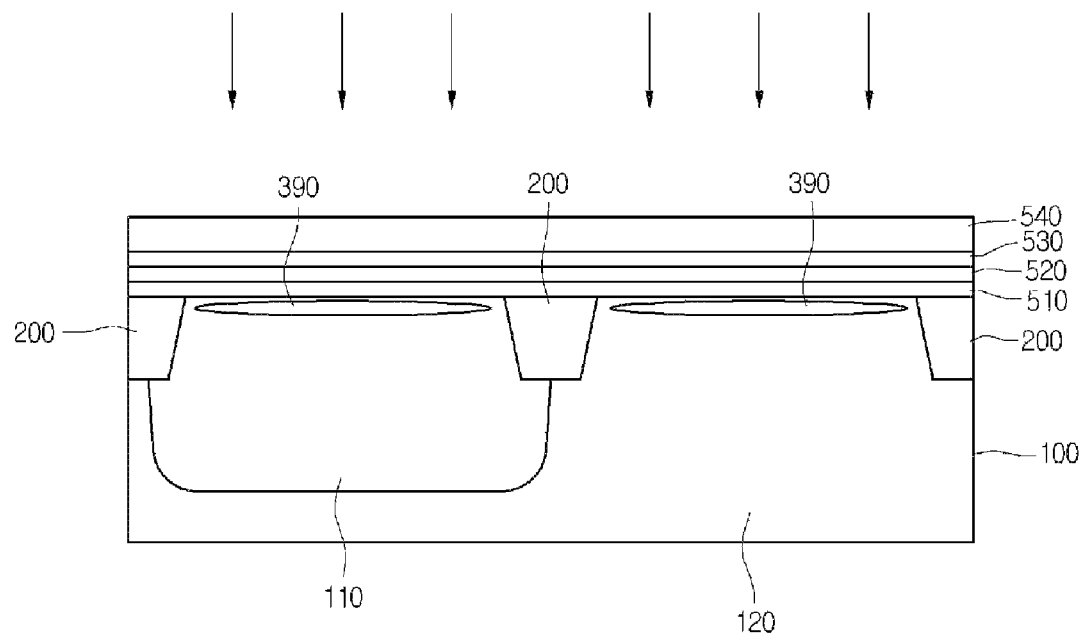

Referring to FIG. 3, a polysilicon layer 540 (which may have a thickness of 70 nm to 100 nm) is formed on the semiconductor substrate 100 with the SiON layer 510, the first HfSiON layer 520, and the second HfSiON layer 530 thereon by low pressure CVD (LP-CVD), and fluorine ions may be implanted into the polysilicon layer 540.

Fluorine ions implanted into the polysilicon layer 540 prevent Hf pinning caused by the Hf of the first and second HfSiON layers 520 and 530.

Figure 4:
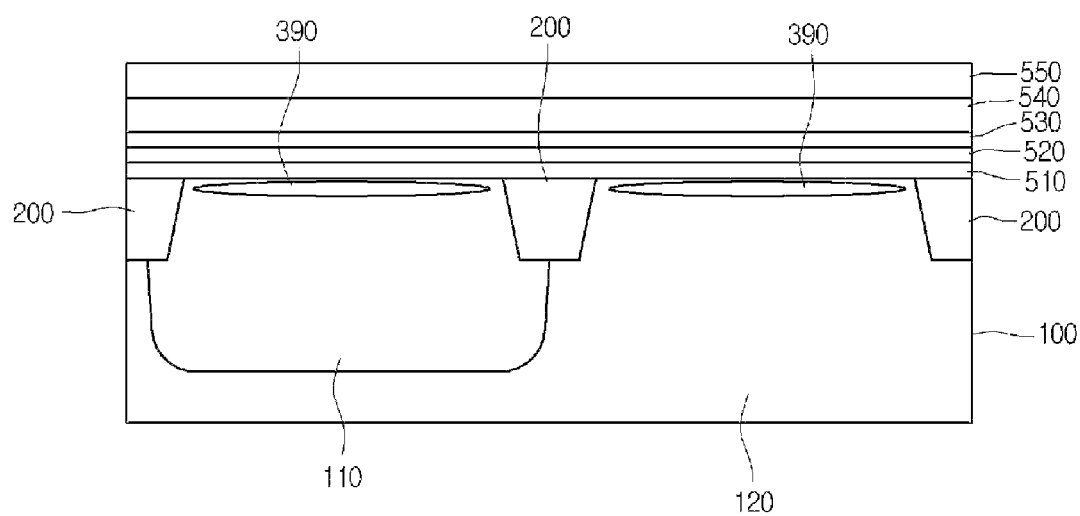

Referring to FIG. 4, a gate electrode layer 550 is formed on the polysilicon layer 540. At this time, the gate electrode 550 may have a thickness of 150 nm to 200 nm and be formed by epitaxial growth of silicon germanium (SiGe). A silicon (Si) structure including germanium (Ge) is effective to selectively form the Ni FUSI structure.

Figure 5:
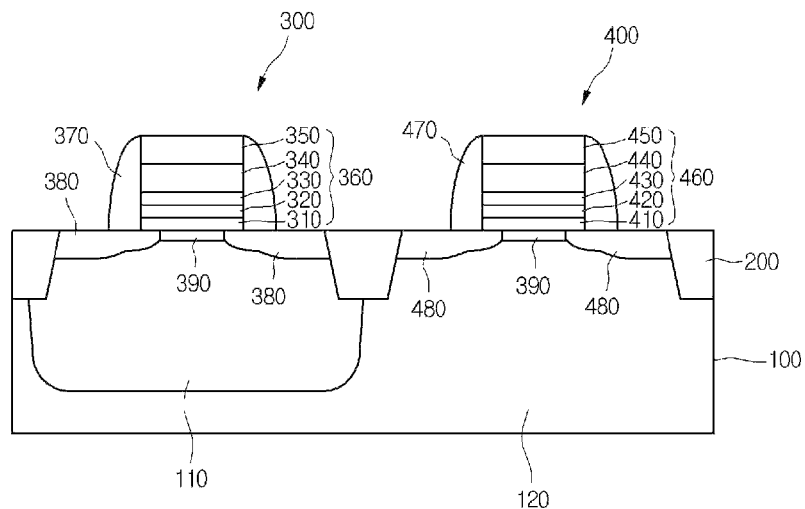

Referring to FIG. 5, the SiON layer 510, the first HfSiON layer 520, the second HfSiON layer 530, the polysilicon layer 540, and the gate electrode layer 550 are patterned, thereby forming the gate structures 360 and 460 constituting the NMOS transistor 300 and the PMOS transistor 400.

Then, impurities such as indium (In), antimony (Sb), arsenic (As), or boron fluoride (BF) are implanted to form a lightly doped drain (LDD) region (not shown), and the spacers 370 and 470 are formed (generally, by blanket deposition of one or more dielectric layers, such as a silicon dioxide or silicon nitride layer, a silicon nitride-on-silicon dioxide bilayer, or a silicon dioxide/silicon nitride/silicon dioxide trilayer, followed by anisotropic etching).

A heavy dose of impurities (listed in the preceding paragraph) are then implanted using the spacers 370 and 470 as an ion implantation mask, thereby forming the source/drain regions 380 and 480 together with the LDD region.

Figure 6:
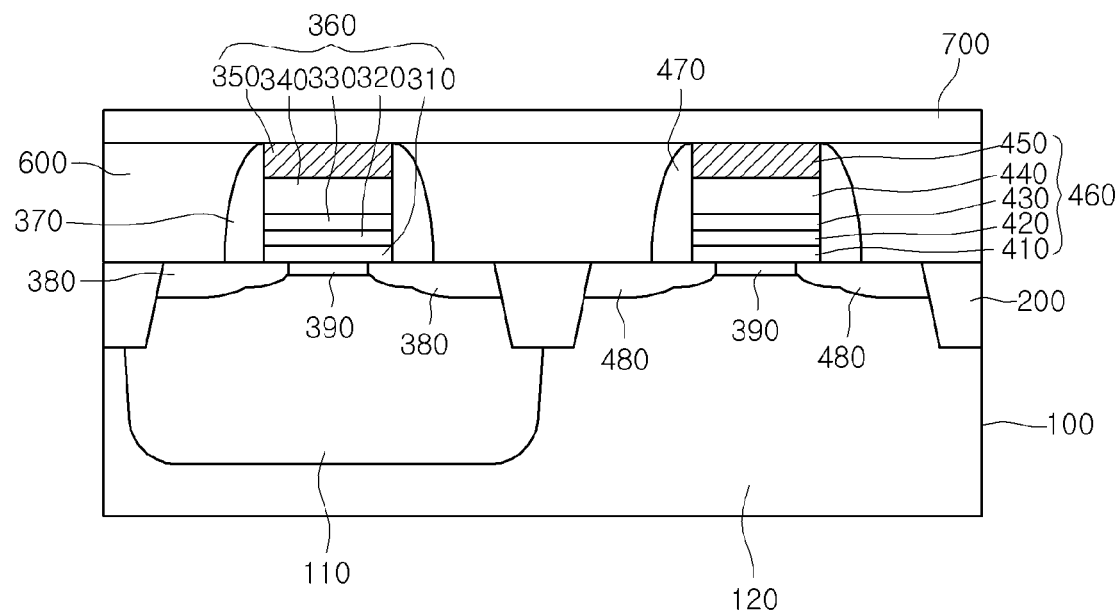

Referring to FIG. 6, a buffer oxide layer 600 is formed on the surface of the semiconductor substrate 100, and a chemical mechanical polishing (CMP) process is performed on the buffer oxide layer 600, so that upper portions of the gate structures 360 and 460 are exposed.

Then, after coating nickel (Ni) 700 on an upper portion of the semiconductor substrate 100 including the gate structures 360 and 460 and the buffer oxide layer 600, a primary heat treatment is performed on the resultant structure at a temperature of 400° C. At this time, Si (and optionally Ge) of the gate electrode layers 350 and 450 reacts with the Ni to form a partial silicide layer.

Thereafter, the portion of the Ni that does not react with the gate electrode layers 350 and 360, and the buffer oxide layer 600, are removed. Subsequently, a secondary heat treatment is performed on the resultant structure, thereby forming the Ni FUSI structure.

Accordingly, the semiconductor device shown in FIG. 7 can be manufactured.

Although not shown, silicide may also be formed on the source/drain regions 380 and 480 shown in FIG. 7.

In addition, according to various embodiments, although the silicide layer may comprise nickel (Ni) silicide, at least one of titanium (Ti), tantalum (Ta), cobalt (Co), and platinum (Pt) may be used instead of Ni to form a metal silicide layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
   a gate structure which includes a silicon oxynitride (SiON) layer on a semiconductor substrate, a first hafnium silicon oxynitride (HfSiON) layer on the silicon oxynitride (SiON) layer, a second hafnium silicon oxynitride (HfSiON) layer on the first hafnium silicon oxynitride (HfSiON) layer, a polysilicon layer on the hafnium silicon oxynitride (HfSiON) layer, and a silicide layer on the polysilicon layer, the second hafnium silicon oxynitride (HfSiON) layer having a hafnium (Hf) content that is less than that of the first hafnium silicon oxynitride (HfSiON) layer;
   spacers at sidewalls of the gate structure; and
   source and drain regions disposed at opposite sides of the gate structure.

2. The semiconductor device of claim 1, wherein the first hafnium silicon oxynitride (HfSiON) layer has a hafnium (Hf) to nitrogen (N) bonding ratio of 40% to 60%, and the second hafnium silicon oxynitride (HfSiON) layer has a hafnium (Hf) to nitrogen (N) bonding ratio of 5% to 10%.

3. The semiconductor device of claim 1, wherein the polysilicon layer includes fluorine ions.

4. The semiconductor device of claim 1, further comprising a fluorinated layer comprising implanted fluorine ions, located between the source and drain regions.

5. The semiconductor device of claim 1, wherein the silicide layer comprises nickel silicide.

6. The semiconductor device of claim 1, further comprising a silicon-germanium layer on the polysilicon layer.

7. The semiconductor device of claim 1, wherein the silicide layer is on the silicon-germanium layer.

8. A method for manufacturing a semiconductor device, the method comprising the steps of:
   forming a gate structure by the steps of forming a silicon oxide (SiOx) layer on a semiconductor substrate, forming a hafnium silicate (HfSiO) layer on the silicon oxide (SiOx) layer, forming a silicon oxynitride (SiON) layer and a hafnium silicon oxynitride (HfSiON) layer by performing a nitrogen plasma process on the semiconductor substrate including the silicon oxide (SiOx) layer and the hafnium silicate (HfSiO) layer, forming a polysilicon layer on the hafnium silicon oxynitride (HfSiON) layer, growing a silicon germanium (SiGe) layer on the polysilicon layer, and patterning the silicon oxynitride (SiON) layer, the hafnium silicon oxynitride (HfSiON) layer, the polysilicon layer, and the silicon germanium (SiGe) layer;
   forming spacers and source and drain regions at sides of the gate structure; and
   forming a gate electrode by siliciding the silicon germanium (SiGe) layer.

9. The method of claim 8, wherein the step of forming the gate electrode includes the steps of:
   forming a buffer oxide layer on the semiconductor substrate and exposing the silicon germanium (SiGe) layer by a chemical mechanical polishing (CMP) process;
   coating metal on the buffer oxide layer and the silicon germanium (SiGe) layer;
   performing a primary heat treatment process on the semiconductor substrate coated with the metal; and
   removing a portion of the metal that remains without reacting with the silicon germanium (SiGe) layer and the buffer oxide layer and performing a secondary heat treatment process on a resultant structure.

10. The method of claim 8, further comprising a step of implanting fluorine ions into the semiconductor substrate before forming the silicon oxide (SiOx) layer on the semiconductor substrate.

11. The method of claim 8, wherein the step of forming the hafnium silicate (HfSiO) layer includes a step of forming a first hafnium silicate (HfSiO) layer and forming a second hafnium silicate (HfSiO) layer on the first hafnium silicate (HfSiO) layer, the second hafnium silicate (HfSiO) layer having a hafnium (Hf) content that is less than that of the first hafnium silicate (HfSiO) layer.

12. The method of claim 11, wherein the first hafnium silicate (HfSiO) layer includes hafnium (Hf) in a ratio of 40% to 60%, and the second hafnium silicate (HfSiO) layer includes hafnium (Hf) in a ratio of 5% to 10%.

13. The method of claim 8, further comprising a step of implanting fluorine ions into the polysilicon layer.

14. A method of manufacturing a semiconductor device, comprising:
   forming a silicon oxide (SiOx) layer on a semiconductor substrate,
   forming a hafnium silicate (HfSiO) layer on the silicon oxide (SiOx) layer,
   forming a silicon oxynitride (SiON) layer and a hafnium silicon oxynitride (HfSiON) layer by performing a nitrogen plasma process on the silicon oxide (SiOx) layer and the hafnium silicate (HfSiO) layer,
   forming a polysilicon layer on the hafnium silicon oxynitride (HfSiON) layer,
   patterning the silicon oxynitride (SiON) layer, the hafnium silicon oxynitride (HfSiON) layer, and the polysilicon layer;
   forming spacers at sides of the gate structure; and
   forming source and drain regions in the semiconductor substrate at opposite sides of the gate structure.

15. The method of claim 14, further comprising growing a silicon germanium (SiGe) layer on the polysilicon layer, wherein the silicon germanium (SiGe) layer is patterned with the SiON layer, the HfSiON layer, and the polysilicon layer.

16. The method of claim 15, further comprising siliciding the silicon germanium (SiGe) layer to form a silicide layer.

17. The method of claim 16, wherein siliciding the SiGe layer includes:
   forming a buffer oxide layer on the semiconductor substrate;
   chemical mechanical polishing (CMP) the buffer oxide layer to expose the silicon germanium (SiGe) layer;
   coating metal on the buffer oxide layer and the silicon germanium (SiGe) layer;
   heating the semiconductor substrate coated with the metal to form a metal silicide; and
   removing an unreacted portion of the metal.

18. The method of claim 17, further comprising, after removing the unreacted portion of the metal, heating a resultant structure.

19. The method of claim 14, wherein forming the hafnium silicate (HfSiO) layer includes forming a first hafnium silicate (HfSiO) layer and forming a second hafnium silicate (HfSiO) layer on the first hafnium silicate (HfSiO) layer, the second hafnium silicate (HfSiO) layer having a hafnium (Hf) content that is less than that of the first hafnium silicate (HfSiO) layer.

* * * * *